(12) United States Patent
Cho et al.

(10) Patent No.: US 9,553,203 B2
(45) Date of Patent: Jan. 24, 2017

(54) DISPLAY PANEL

(71) Applicant: Samsung Display Co., Ltd., Yongin, Gyeonggi-Do (KR)

(72) Inventors: Seung-Hwan Cho, Suwon-si (KR); Yoonho Khang, Yongin-si (KR); Hyunjae Na, Seoul (KR); Youngki Shin, Hwaseong-si (KR); Donghwan Shim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 115 days.

(21) Appl. No.: 14/506,061

(22) Filed: Oct. 3, 2014

(65) Prior Publication Data

US 2015/0200240 A1 Jul. 16, 2015

(30) Foreign Application Priority Data

Jan. 13, 2014 (KR) .......................... 10-2014-0004083

(51) Int. Cl.
*H01L 29/45* (2006.01)
*H01L 29/786* (2006.01)
*H01L 29/66* (2006.01)

(52) U.S. Cl.
CPC ........... *H01L 29/7869* (2013.01); *H01L 29/45* (2013.01); *H01L 29/66969* (2013.01)

(58) Field of Classification Search
None
See application file for complete search history.

(56) References Cited

U.S. PATENT DOCUMENTS

| 2010/0193785 A1* | 8/2010 | Kimura .......................... 257/43 |
| 2011/0240998 A1 | 10/2011 | Morosawa et al. |
| 2012/0280223 A1 | 11/2012 | Kim et al. |

FOREIGN PATENT DOCUMENTS

| KR | 1020100075058 A | 7/2010 |
| KR | 1020120075803 A | 7/2012 |
| KR | 1020120124126 A | 11/2012 |

\* cited by examiner

*Primary Examiner* — Fernando L Toledo
*Assistant Examiner* — Valerie N Newton
(74) *Attorney, Agent, or Firm* — Cantor Colburn LLP

(57) ABSTRACT

A display panel includes a base substrate including a pixel area and a peripheral area, a semiconductor layer disposed on a portion of the base substrate, a display element disposed in the pixel area, and a thin film transistor which controls the display element and includes an input electrode, an output electrode and a control electrode, in which the semiconductor layer includes a first portion disposed on the input electrode of the first thin film transistor, a second portion disposed on the output electrode of the first thin film transistor, and a third portion which connects the first portion and the second portion, overlaps the control electrode of the first thin film transistor, and defines a channel of the first thin film transistor.

20 Claims, 10 Drawing Sheets

DISPLAY PANEL

This application claims priority to Korean Patent Application No. 10-2014-0004083, filed on Jan. 13, 2014, and all the benefits accruing therefrom under 35 U.S.C. §119, the content of which in its entirety is herein incorporated by reference.

BACKGROUND

1. Field

The disclosure relates to a display panel. More particularly, the disclosure relates to a display panel with improved display quality.

2. Description of the Related Art

A display panel includes a plurality of pixels disposed on a base substrate. The base substrate may include a plurality of pixel areas and a peripheral area disposed adjacent to the pixel areas. The pixels may be arranged in the pixel areas, respectively.

Each of the pixels may include a display element and a circuit part that controls the display element. The display element and the circuit part included in a pixel are disposed in a corresponding pixel area of the pixel areas. When viewed in a plan view, an aperture ratio of each pixel area is determined based on a ratio of an area of the display element to an area of the corresponding pixel area. As the circuit part becomes complicated, an area occupied by the circuit part may increase such that the aperture ratio may be lowered.

SUMMARY

Exemplary embodiments of the invention provide a display panel which includes a pixel having improved aperture ratio and a thin film transistor having reduced contact resistance.

Exemplary embodiments of the invention provide a display panel including a base substrate including a pixel area and a peripheral area, a semiconductor layer disposed on a portion of the base substrate, a display element disposed in the pixel area, and a thin film transistor which controls the display element and comprises an input electrode, an output electrode and a control electrode, in which the semiconductor layer includes a first portion disposed on the input electrode of the first thin film transistor, a second portion disposed on the output electrode of the first thin film transistor, and a third portion which connects the first portion and the second portion, overlaps the control electrode of the first thin film transistor, and defines a channel of the first thin film transistor.

In an exemplary embodiment, the semiconductor layer may include a metal oxide semiconductor material.

In an exemplary embodiment, the first thin film transistor may further include an insulating pattern portion disposed on the semiconductor layer to overlap a portion of the third portion, and the control electrode of the first thin film transistor may be disposed on the insulating pattern portion.

In an exemplary embodiment, the third portion may include an input region connected to the first portion and comprising a reduced metal from the metal oxide semiconductor material, an output region connected to the second portion and comprising the reduced metal from the metal oxide semiconductor material, and a channel region disposed between the input region and the output region to connect the input region and the output region, where the channel region may overlap the insulating pattern portion.

In an exemplary embodiment, the display panel may further include an insulating layer disposed between the control electrode of the first thin film transistor and the semiconductor layer, where the control electrode may be disposed to face the semiconductor and may be disposed under the third portion.

In an exemplary embodiment, the first thin film transistor may further include a protection pattern portion disposed on the channel region of the third portion.

In an exemplary embodiment, the display panel may further include a data line disposed in the peripheral area, connected to the input electrode of the first thin film transistor, and extending in a first direction, and the semiconductor layer may further include a line portion connected to the first portion and which overlaps the data line.

In an exemplary embodiment, the line portion may include a reduced metal from the metal oxide semiconductor material.

In an exemplary embodiment, the line portion has a width in a second direction, which is perpendicular to the first direction, substantially the same as a width of the data line in the second direction.

In an exemplary embodiment, the display panel may further include a gate line disposed in the peripheral area, connected to the control electrode, and extending substantially in the second direction.

In an exemplary embodiment, the display element includes an organic light emitting diode.

In an exemplary embodiment, the display panel may further include a second thin film transistor, which controls a driving current flowing through the display element, and a capacitor including a lower electrode connected to the output electrode and an upper electrode connected to the control electrode, where the display element may include an organic light emitting diode.

In an exemplary embodiment, the organic light emitting diode may include a first electrode connected to an output electrode of the second thin film transistor, an organic light emitting layer disposed on the first electrode, and a second electrode disposed on the organic light emitting layer.

In an exemplary embodiment, the semiconductor layer may further include a capacitance portion connected to the second portion and disposed on the lower electrode.

In an exemplary embodiment, the display panel may further include an opposite substrate disposed opposite to the base substrate, and a liquid crystal layer interposed between the base substrate and the opposite substrate, where the display element may include a liquid crystal capacitor.

Exemplary embodiments of the invention provide a display panel including a base substrate including a pixel area and a peripheral area, a conductive layer disposed on the base substrate, a metal oxide semiconductor layer disposed on portions of the conductive layer, a display element disposed in the pixel area, and a thin film transistor which controls the display element, where the thin film transistor includes an input electrode including a first portion of the conductive layer and a first portion of the metal oxide semiconductor layer disposed on the first portion of the conductive layer, an output electrode including a second portion of the conductive layer and a second portion of the metal oxide semiconductor layer disposed on the second portion of the conductive layer, a channel defined by a third portion of the metal oxide semiconductor layer which connects the first portion of the metal oxide semiconductor layer and the second portion of the metal oxide semiconductor layer, and a control electrode disposed to overlap the third portion of the metal oxide semiconductor layer and insulated from the third portion of the metal oxide semiconductor layer.

In an exemplary embodiment, the thin film transistor may further include an insulating pattern portion disposed on the metal oxide semiconductor layer to overlap a portion of the third portion of the metal oxide semiconductor layer, where the control electrode is disposed on the insulating pattern portion.

In an exemplary embodiment, the third portion of the metal oxide semiconductor layer may include an input region connected to the first portion of the metal oxide semiconductor layer and including a reduced metal from the metal oxide semiconductor layer, an output region connected to the second portion of the metal oxide semiconductor layer and including the reduced metal from the metal oxide semiconductor layer and a channel region disposed between the input region and the output region to connect the input region and the output region.

In an exemplary embodiment, the display panel may further include an insulating layer disposed between the control electrode and the semiconductor layer, where the control electrode is disposed to face the metal oxide semiconductor layer and is disposed under the third portion.

In an exemplary embodiment, the display panel may further include a data line which is disposed in the peripheral area, connected to the input electrode of the thin film transistor and extending substantially in a first direction, and a gate line which is disposed in the peripheral area, connected to the control electrode of the thin film transistor and extending substantially in a second direction, that is perpendicular to the first direction, where the metal oxide semiconductor layer may further include a line portion which overlaps the data line.

According to exemplary embodiment described herein, the portions of the semiconductor layer are directly disposed on the input electrode and the output electrode of the thin film transistor, respectively. The first portion of the semiconductor layer, which is disposed on the input electrode, and the second portion of the semiconductor layer, which is disposed on the output electrode, are connected to the third portion of the semiconductor layer, which defines the channel of the thin film transistor. The input electrode and the output electrode are connected to the third portion of the semiconductor layer without forming contact holes, such that the aperture ratio of the pixel increases.

In exemplary embodiments, the output electrode is electrically connected to the pixel electrode through the first portion of the semiconductor layer. The current path of the thin film transistor is formed through the input electrode, the third portion of the semiconductor layer, the output electrode, and the pixel electrode. Therefore, the thin film transistor has a relatively low contact resistance between the output electrode and the pixel electrode when compared to a conventional thin film transistor having a current path formed through the semiconductor layer. In such embodiments, the signal delay, e.g., resistance-capacitance ("RC") delay, in the thin film transistor may be effectively prevented even when the output electrode and the pixel electrode are electrically connected to each other while the second portion of the semiconductor layer disposed on the output electrode is disposed therebetween.

BRIEF DESCRIPTION OF THE DRAWINGS

The above and other features of the invention will become readily apparent by reference to the following detailed description when considered in conjunction with the accompanying drawings, in which.

DETAILED DESCRIPTION

Figure 1:
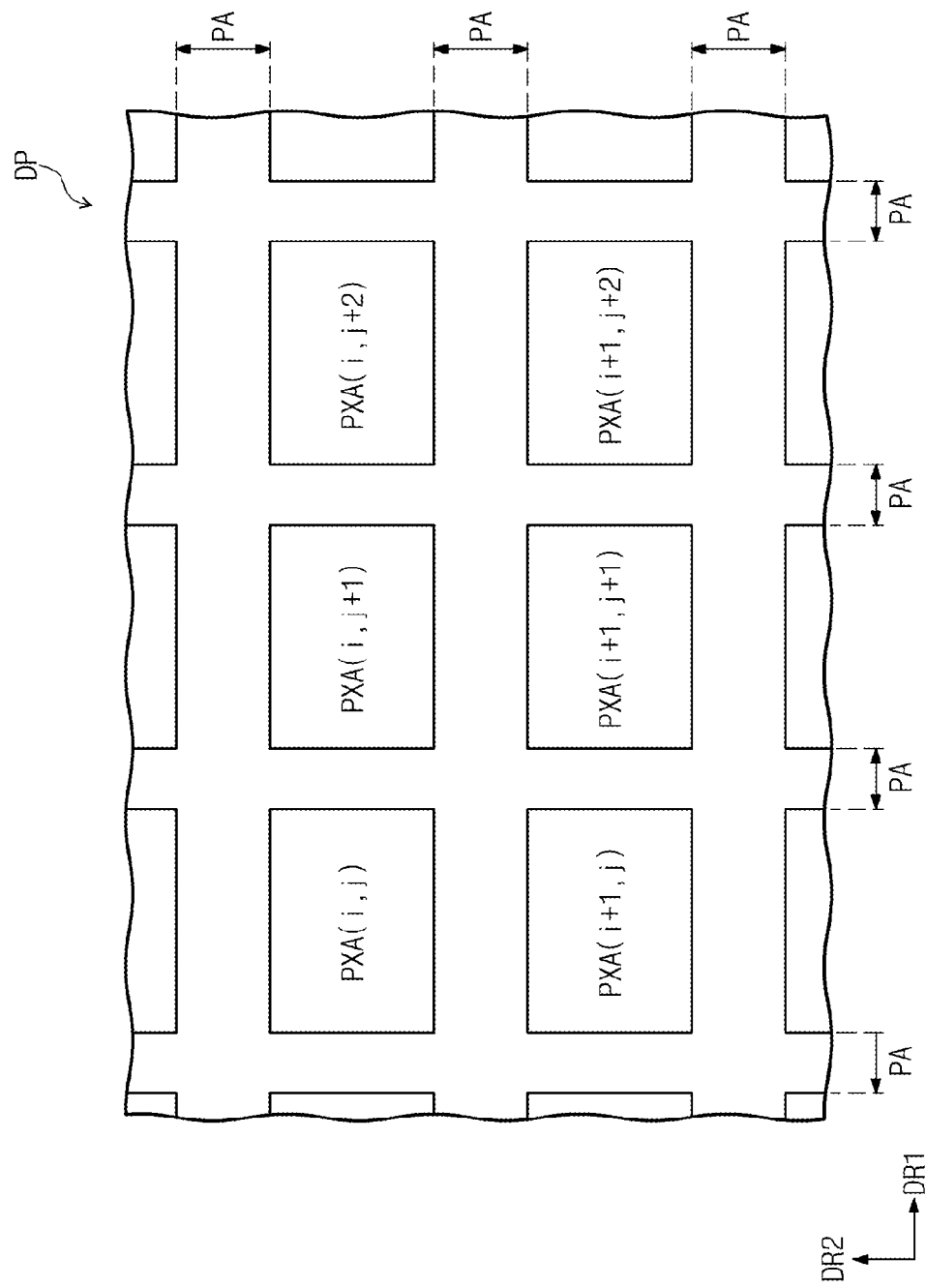
FIG. 1 is a plan view showing an exemplary embodiment of a display panel according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms, including "at least one,", unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a plan view showing an exemplary embodiment of a display panel according to the invention.

Referring to FIG. 1, an exemplary embodiment of a display panel DP includes a plurality of pixel areas PXA(i, j) to PXA(i+1, j+2) and peripheral areas PA disposed adjacent to the pixel areas PXA(i, j) to PXA(i+1, j+2) in a plan view defined by a first direction DR1 and a second direction DR2 substantially perpendicular to the first direction DR1. The pixel areas PXA(i, j) to PXA(i+1, j+2) are arranged substantially in a matrix form. Here, each of 'i' and 'j' is a natural number, and PXA(i, j) may refer to a pixel area in an i-th row and a j-th column.

Six pixel areas PXA(i, j) to PXA(i+1, j+2) among the plurality of pixel areas are shown in FIG. 1 for convenience of illustration. The display panel DP includes a display surface defined by the first direction DR1 and the second direction DR2. An image is displayed on the display surface of the display panel DP.

Among the pixel areas PXA(i, j) to PXA(i+1, j+2), three pixel areas arranged in a same row display different colors from each other. In one exemplary embodiment, for example, a red color, a green color and a blue color are respectively displayed in three pixel areas PXA(i, j) to PXA(i, j+2) in the i-th row.

The display panel DP includes pixels (not shown) disposed in the pixel areas PXA(i, j) to PXA(i+1, j+2) and signal lines (not shown) disposed in the peripheral areas PA. The signal lines apply signals to the pixels. The signal lines may include gate lines extending substantially in the first direction DR1 and data lines extending substantially in the second direction DR2. The signal lines may further include a power supply line extending substantially in the second direction DR2.

In an exemplary embodiment, each pixel may be an organic light emitting pixel. The organic light emitting pixel includes an organic light emitting diode as a display element. In such an embodiment, the organic light emitting pixel includes a thin film transistor to control the organic light emitting diode, but the pixels should not be limited to the organic light emitting pixel.

Figure 2:
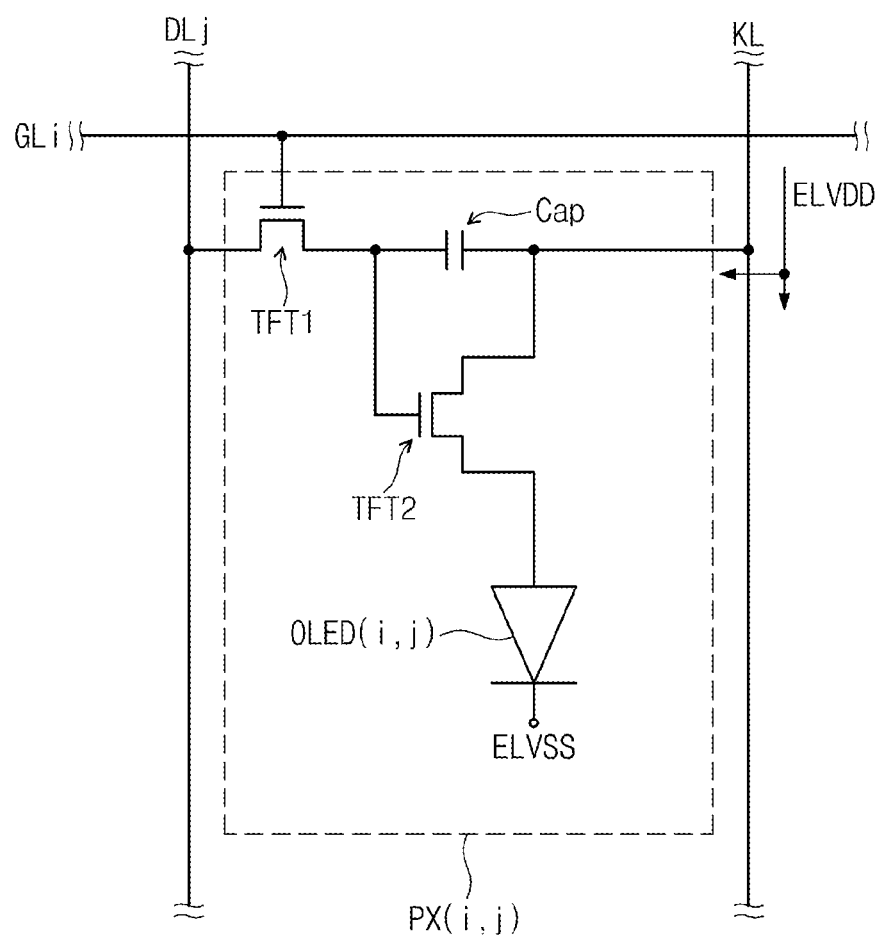
FIG. 2 is an equivalent circuit diagram showing an exemplary embodiment of a pixel according to the invention.

FIG. 2 is an equivalent circuit diagram showing an exemplary embodiment of a pixel according to the invention. In an exemplary embodiment, as shown in FIG. 2 the pixel may be an organic light emitting pixel PX(i, j). The pixel PX(i, j) includes a first thin film transistor TFT1, a capacitor Cap, a second thin film transistor TFT2, and an organic light emitting diode OLED(i, j). The first thin film transistor TFT1, the capacitor Cap, and the second thin film transistor TFT2 collectively define a circuit part to control the organic light emitting diode OLED(i, j).

The pixel PX(i, j) is connected to an i-th gate line GLi and a j-th data line DLj. The i-th gate line GLi is one of the gate lines disposed in the display panel DP and the j-th data line DLj is one of the data lines disposed in the display panel DP.

The first thin film transistor TFT1 outputs a data signal applied to the j-th data line DLj in response to a gate signal applied to the i-th gate line GLi. The second thin film transistor TFT2 controls a driving current flowing through the organic light emitting diode OLED(i, j). The pixel PX(i, j) receives a first voltage ELVDD and a second voltage ELVSS, which have different voltage levels from each other. The pixel PX(i, j) receives the first voltage ELVDD from the power supply line KL.

The organic light emitting diode OLED(i, j) includes a first electrode applied with a voltage corresponding to the first voltage ELVDD from the second thin film transistor TFT2 and a second electrode applied with the second voltage ELVSS. The organic light emitting diode OLED(i, j) emits light during a turn-on period of the second thin film transistor TFT2. The capacitor Cap controls the turn-on period or the activation level of the second thin film transistor TFT2. Accordingly, in such an embodiment, a brightness of the organic light emitting diode OLED(i, j) is controlled by a level of the voltage output from the first thin film transistor TFT1. In such an embodiment, the configuration of the pixel PX(i, j) may be variously modified.

Figure 3:
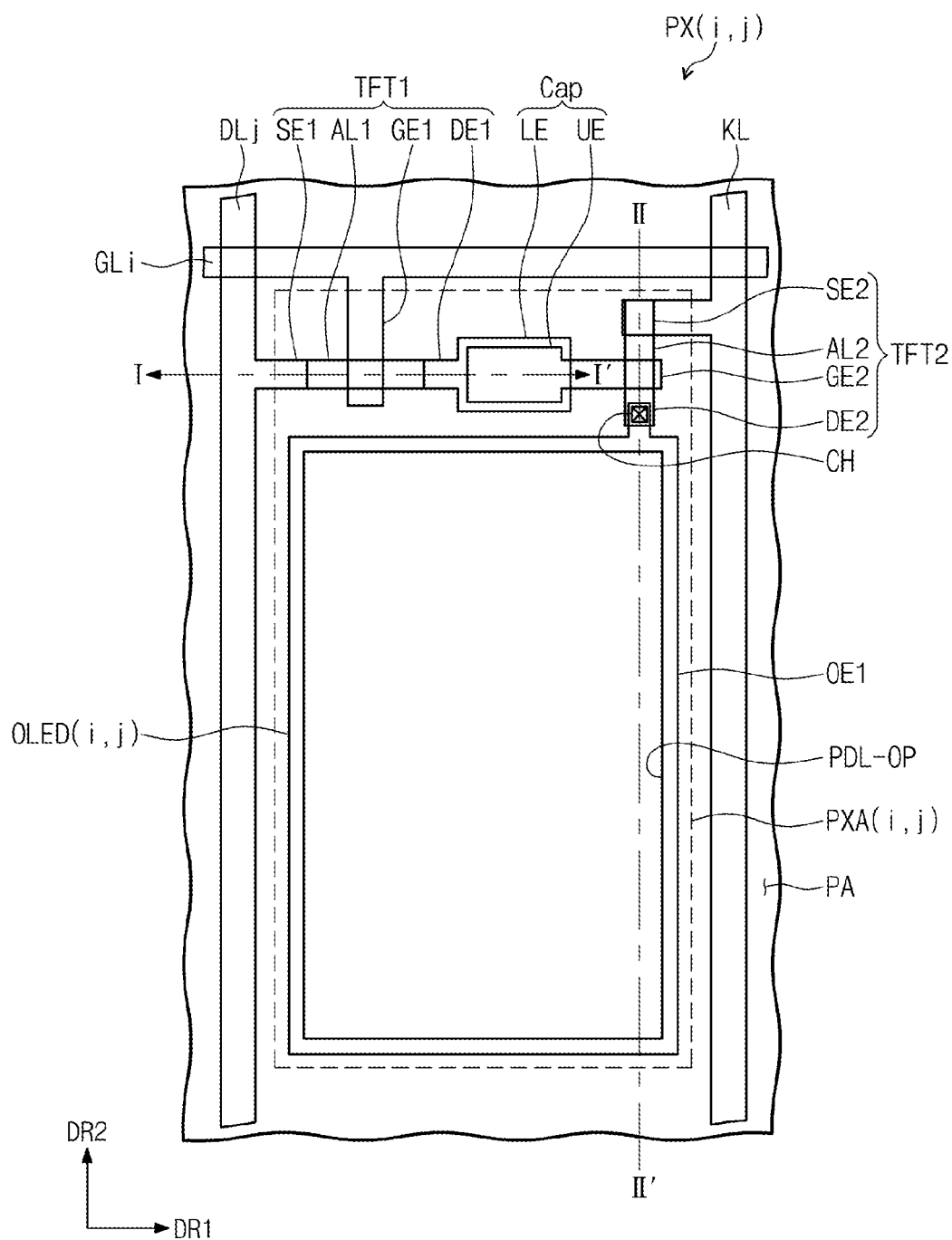
FIG. 3 is a plan view showing an exemplary embodiment of a pixel according to the invention.

FIG. 3 is a plan view showing an exemplary embodiment of a pixel according to the invention. In FIG. 3, portions of the organic light emitting diode and layers commonly disposed on the display panel are omitted for convenience of illustration.

Figure 4:
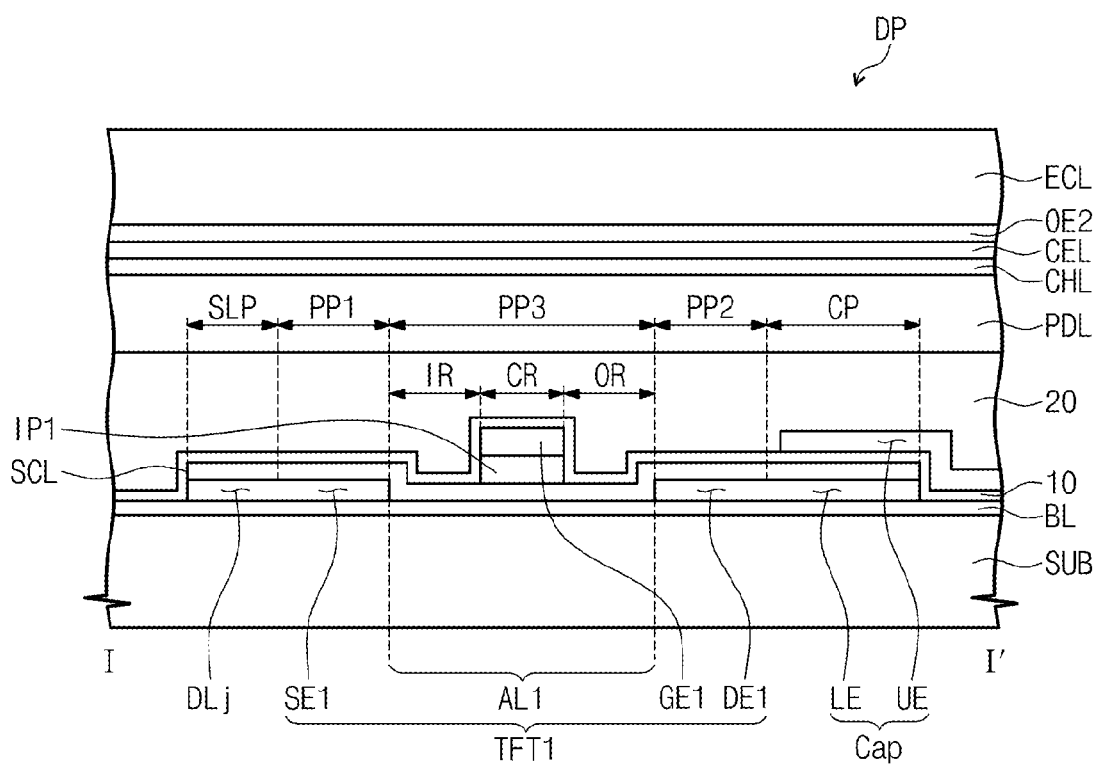
FIG. 4 is a cross-sectional view taken along line I-I' of the display panel shown in FIG. 3.
Figure 5:
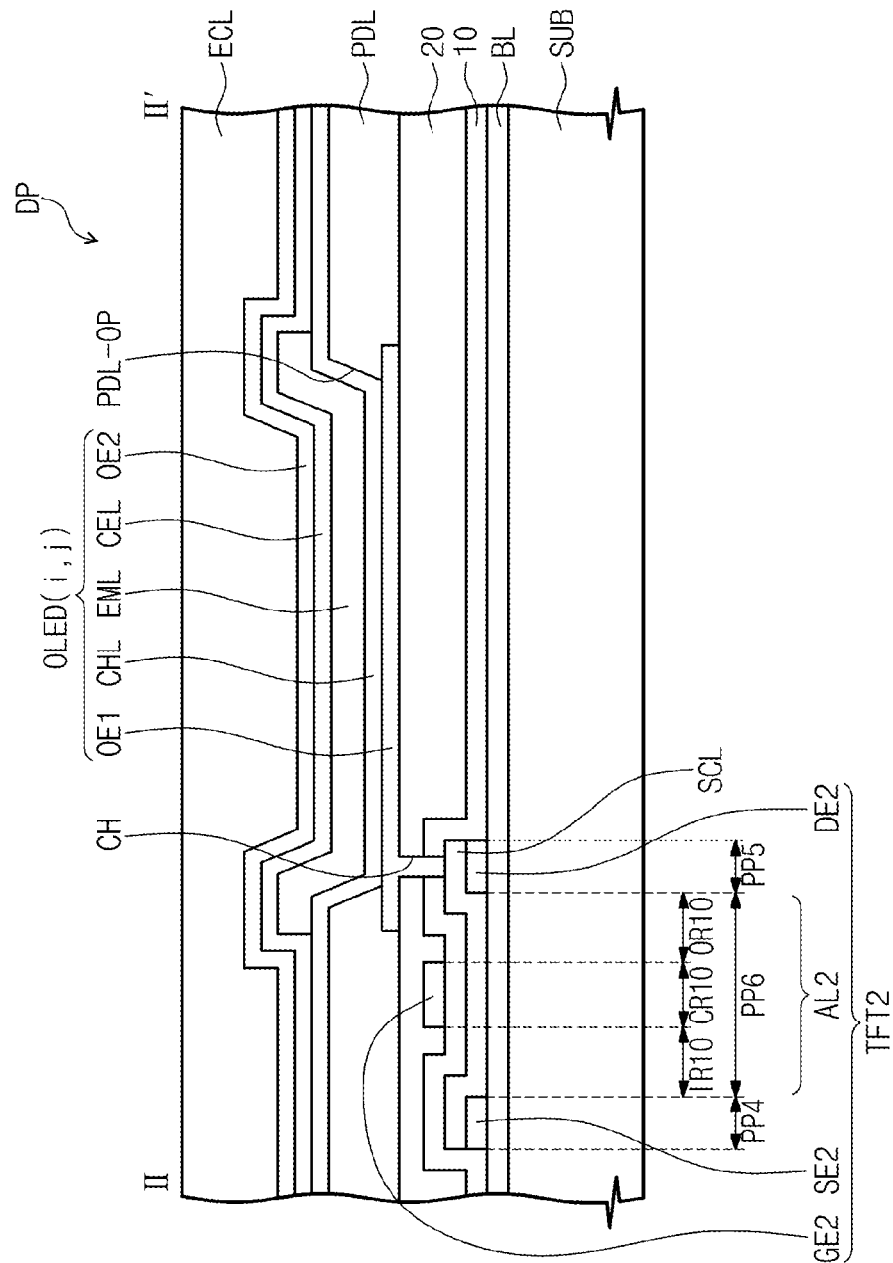
FIG. 5 is a cross-sectional view taken along line II-IF of the display panel shown in FIG. 3.

FIG. 4 is a cross-sectional view taken along line I-I' of the display panel shown in FIG. 3, and FIG. 5 is a cross-sectional view taken along line II-II' of the display panel shown in FIG. 3.

Referring to FIGS. 3 to 5, the display panel DP includes a base substrate SUB. The base substrate SUB may be a glass substrate, a plastic substrate, or a stainless steel substrate, for example.

In an exemplary embodiment, a buffer layer BL is disposed on a surface of the base substrate SUB. A plurality of conductive layers and a semiconductor layer SCL may be disposed on the surface of the base substrate SUB. In such an embodiment, the buffer layer BL improves an adhesive force of the conductive layers or the semiconductor layer. A material of the buffer layer BL may be determined based on elements disposed on the buffer layer BL. In an alternative exemplary embodiment, the buffer layer BL may be omitted.

In an exemplary embodiment, the conductive layers may be patterned. In such an embodiment, portions of the patterned conductive layers defines as portions of the first thin film transistor TFT1, the second thin film transistor TFT2 or the capacitor Cap, and other portions of the patterned conductive layers defines the i-th gate line GLi, the j-th data line DLj or the power supply line KL.

The semiconductor layer SCL may be patterned to partially overlap the base substrate SUB. Portions of the patterned semiconductor layer SCL defines portions of the first thin film transistor TFT1 and the second thin film transistor TFT2, other portions of the patterned semiconductor layer SCL are disposed to overlap the i-th gate line GLi, the j-th data line DLj or the power supply line KL.

As shown in FIG. 3, the first thin film transistor TFT1 includes an input electrode SE1 (hereinafter, referred to as a first input electrode), an output electrode DE1 (hereinafter, referred to as a first output electrode), an active part AL1 (hereinafter, referred to as a first active part), and a control electrode GE1 (hereinafter, referred to as a first control electrode). The second thin film transistor TFT2 includes an input electrode SE2 (hereinafter, referred to as a second input electrode), an output electrode DE2 (hereinafter, referred to as a second output electrode), an active part AL2 (hereinafter, referred to as a second active part), and a control electrode GE2 (hereinafter, referred to as a second control electrode). The capacitor Cap includes a lower electrode LE and an upper electrode UE.

The first input electrode SE1 is branched from the j-th data line DLj. The first control electrode GE1 is branched from the i-th gate line GLi. The first output electrode DE1 is spaced apart from the first input electrode SE1. The lower electrode LE of the capacitor Cap is connected to the first output electrode DE1. The lower electrode LE is disposed on the same layer as the first output electrode DE1. The lower electrode LE and the first output electrode DE1 may be integrally formed as a single unitary and indivisible unit. The upper electrode UE of the capacitor Cap overlaps the lower electrode LE.

The second input electrode SE2 is branched from the power supply line KL. The second control electrode GE2 is connected to the upper electrode UE. The second output electrode DE2 is spaced apart from the second input electrode SE2. The second output electrode DE2 overlaps a contact hole CH.

As shown in FIG. 4, the j-th data line DLj, the first input electrode SE1, and the first output electrode DE1 are disposed on the buffer layer BL. The lower electrode LE connected to the first output electrode DE1 is disposed on the buffer layer BL.

Portions of the semiconductor layer SCL are disposed on the buffer layer BL. A first portion PP1 of the semiconductor layer SCL is disposed on the first input electrode SE1, and a second portion PP2 of the semiconductor layer SCL is disposed on the first output electrode DE1. A third portion PP3 of the semiconductor layer SCL is disposed on the buffer layer BL. The third portion PP3 connects the first portion PP1 and the second portion PP2.

A line portion SLP of the semiconductor layer SCL is disposed on the j-th data line DLj. The line portion SLP is connected to the first portion PP1. A capacitance portion CP of the semiconductor layer SCL is disposed on the lower electrode LE. The capacitance portion CP is connected to the second portion PP2.

An insulating pattern portion IP1, which overlaps at least a portion of the third portion PP3, is disposed on the third portion PP3. The first control electrode GE1 is disposed on the insulating pattern portion IP1. A first insulating layer 10 is disposed on the buffer layer BL to cover the semiconductor layer SCL. The upper electrode UE is disposed on the first insulating layer 10 to overlap the lower electrode LE.

The first insulating layer 10 includes an inorganic material or an organic material. The first insulating layer 10 may be an organic or inorganic layer. The first insulating layer 10 may have a multi-layer structure. The first insulating layer 10 may have a plurality of organic layers, a plurality of inorganic layers, or a plurality of layers including an organic layer and an inorganic layer.

The conductive layer, which includes the j-th data line DLj, the first input electrode SE1, the first output electrode DE1 and the lower electrode LE, may include a metal material, such as aluminum (Al), silver (Ag), copper (Cu), molybdenum (Mo), chromium (Cr), tantalum (Ta), titanium (Ti), or alloys thereof. The i-th gate line GLi, the first control electrode GE1, and the upper electrode UE may include a metal material, such as aluminum (Al), silver (Ag), copper (Cu), molybdenum (Mo), chromium (Cr), tantalum (Ta), titanium (Ti), or alloys thereof.

The semiconductor layer SCL may include a metal oxide semiconductor material. In one exemplary embodiment, for example, the metal oxide semiconductor material may include a metal oxide including zinc (Zn), indium (In), gallium (Ga), tin (Sn), Titanium (Ti), or a combination thereof, e.g., a mixture thereof or an oxide of the mixture. In one exemplary embodiment, for example, the semiconductor layer SCL may include indium-tin oxide ("ITO"), indium-gallium-zinc oxide ("IGZO") or indium-zinc oxide ("IZO").

In an exemplary embodiment, the third portion PP3 defines the first active part AU of the first thin film transistor TFT1. The first active part AL1 defines a channel of the first thin film transistor TFT1. The third portion PP3 may be divided into three regions. In such an embodiment, the third portion PP3 is divided into an input region IR disposed adjacent to the first portion PP1, an output region OR disposed adjacent to the second portion PP2, and a channel region CR disposed between the input region IR and the output region OR. The channel region CR is an area where the insulating pattern portion IP1 is disposed. The channel region CR may be provided or formed during a process for providing the insulating pattern portion IP thereon.

In an exemplary embodiment of a method of manufacturing the display panel DP, the first insulating layer 10 may be formed using a plasma process, and the input region IR and the output region OR of the third portion PP3 may be reduction-treated. In such an embodiment, the first portion PP1, the second portion PP2, the line portion SLP and the capacitance portion CP may be reduction-treated. In such an embodiment, the channel region CR of the third portion PP3 is protected by the insulating pattern portion IP1, such that the channel region CR of the third portion PP3 is not reduction-treated. According to an exemplary embodiment of the invention, portions of the semiconductor layer SCL may be reduction-treated through a predetermined reduction treatment process.

The input region IR and the output region OR of the third portion PP3 include a reduced metal from the metal oxide semiconductor material of the semiconductor layer SCL. The first portion PP1, the second portion PP2, the line portion SLP and the capacitance portion CP include a reduced metal from the metal oxide semiconductor material of the semiconductor layer SCL. The reduced metal from the metal oxide semiconductor material has a predetermined thickness from an upper surface of the portions and defines a metal layer.

The thickness of the metal layer is determined by an extent of reduction of the semiconductor layer SCL.

The channel region CR of the third portion PP3, which is not reduction-treated, defines the channel of the first thin film transistor TFT1. In an exemplary embodiment, the first input electrode SE1 and the first output electrode DE1 are contact with the first active part AL1. In such an embodiment, a contact hole, which may be provided for a connection between the first active part and the input/output electrode, is omitted, such that the structure of the pixel PX(i, j) becomes simplified and the aperture ratio of the pixel PX(i, j) is increased.

Referring to FIGS. 3 and 4, the third portion PP3 is disposed between the first input electrode SE1 and the first output electrode DE1. A width in the second direction DR2 of the first portion PP1 and the second portion PP2 is substantially the same as a width in the second direction DR2 of the first input electrode SE1 and the first output electrode DE1, respectively. A width of the line portion SLP in the first direction DR1 is substantially the same as a width of the j-th data line DLj in the first direction DR1. When viewed in a plan view, the shape of the capacitance portion CP may be substantially the same as the shape of the lower electrode LE.

In another exemplary embodiment of the invention, portions of the semiconductor layer may be defined as portions of the thin film transistor, portions of the signal line or portions of the capacitor. In such an embodiment, the first input electrode SE1 and the first output electrode DE1 may be configured to include portions of the conductive layer and portions of the semiconductor layer disposed on the conductive layer.

In one exemplary embodiment, for example, the first input electrode SE1 and the first portion PP1 disposed on the first input electrode SE1 function as an input electrode of the first thin film transistor TFT1. The first output electrode DE1 and the second portion PP2 disposed on the first output electrode DE1 function as an output electrode of the first thin film transistor TFT1. The j-th data line DLj and the line portion SLP disposed on the j-th data line DLj function as a data line.

As shown in FIG. 5, the second input electrode SE2 and the second output electrode DE2 of the second thin film transistor TFT2 are disposed on the buffer layer BL. Portions of the semiconductor layer SCL are disposed on the buffer layer BL. A fourth portion PP4 of the semiconductor layer SCL is disposed on the second input electrode SE2. A fifth portion PP5 of the semiconductor layer SCL is disposed on the second output electrode DE2.

A sixth portion PP6 of the semiconductor layer SCL is disposed on the buffer layer BL. The sixth portion PP6 connects the fourth portion PP4 and the fifth portion PP5. The sixth portion PP6 corresponds to the second active part AL2 of the second thin film transistor TFT2. The sixth portion PP6 is divided into three regions, e.g., an input region IR10, an output region OR10 and a channel region CR10.

The first insulating layer 10 covers the fourth portion PP4, the fifth portion PP5, and the sixth portion PP6. The second control electrode GE2 of the second thin film transistor TFT2 is disposed on the first insulating layer 10. The second control electrode GE2 overlaps the channel region CR10. During an exemplary embodiment of the manufacturing process of the display panel DP, the input region IR10 and the output region OR10 of the sixth portion PP6 may be reduction-treated. In such an embodiment, the fourth portion PP4 and the fifth portion PP5 are reduction-treated. In such an embodiment, the channel region CR10 of the sixth portion PP6 is covered or protected by the second control electrode GE2, such that the channel region CR10 of the sixth portion PP6 is not reduction-treated.

As shown in FIGS. 4 and 5, a second insulating layer 20 is disposed on the first insulating layer 10. The second insulating layer 20 may include at least one of an inorganic material and an organic material. In an exemplary embodiment, the second insulating layer 20 may be an organic layer, and the second insulating layer 20 may provide a planarized surface.

The organic light emitting diode OLED(i, j) is disposed on the second insulating layer 20. The organic light emitting diode OLED(i, j) includes a first electrode OE1, a second electrode OE2, and an organic light emitting layer EML interposed between the first electrode OE1 and the second electrode OE2. In an exemplary embodiment, the first electrode OE1 may be an anode, and the second electrode OE2 may be a cathode. The first electrode OE1 may include a transparent conductive material or a metal material, and the material of the first electrode OE1 may be determined based on a light emission direction thereof The first electrode OE1 is disposed on the second insulating layer 20. The first electrode OE1 is connected to the fifth portion PP5 through a contact hole CH defined through the first insulating layer 10 and the second insulating layer 20. The contact hole CH may be defined by two penetrating holes formed successively through the first insulating layer 10 and the second insulating layer 20.

The second output electrode DE2 is electrically connected to the first electrode OE1 through the fifth portion PP5. When the second thin film transistor TFT2 is turned on, a current path of the second thin film transistor TFT2 is formed via the second input electrode SE2, the sixth portion PP6, the second output electrode DE2 and the first electrode OE1.

In such an embodiment, where the current path is formed through the second output electrode DE2, a contact resistance between the second thin film transistor TFT2 and the first electrode OE1 does not increase even though the fifth portion PP5 connected to the sixth portion PP6 is disposed on the second output electrode DE2. Thus, in such an embodiment, a signal delay, e.g., resistance-capacitance ("RC") delay, may not occur in the second thin film transistor TFT2.

A pixel definition layer PDL is disposed on the second insulating layer 20. The pixel definition layer PDL may overlap the pixel area PXA(i, j) and the peripheral area PA. An opening PDL-OP is defined or formed through the pixel definition layer PDL. The first electrode OE1 is exposed through the opening PDL-OP.

The organic light emitting layer EML is disposed on the first electrode OE1 to overlap the opening PDL-OP. The organic light emitting layer EML may be disposed in the opening PDL-OP. The second electrode OE2 is disposed on the organic light emitting layer EML. A first common layer CHL is disposed between the first electrode OE1 and the organic light emitting layer EML. A second common layer CEL is disposed between the organic light emitting layer EML and the second electrode OE2. The first and second common layers CHL and CEL may be commonly disposed not only on the pixel area PXA(i, j) and the peripheral area PA, but also on other pixel areas. The second electrode OE2 may be disposed in the entire pixel areas.

The first common layer CHL may include at least a hole injection layer, and the second common layer CEL may include an electron injection layer. The first common layer CHL may further include a hole transport layer disposed between the hole injection layer and the organic light emitting layer EML, and the second common layer CEL may further include an electron transport layer disposed between the electron injection layer and the organic light emitting layer EML.

A sealing layer ECL is disposed on the second electrode OE2 to cover the organic light emitting diode OLED(i, j). The sealing layer ECL is commonly disposed on the base substrate SUB. The sealing layer ECL may be integrally formed as a single unitary and indivisible unit. In one exemplary embodiment, for example, the sealing layer ECL commonly covers the pixel areas PXA(i, j) to PXA(i+1, j+2) and the peripheral areas PA adjacent to the pixel areas PXA(i, j) to PXA(i+1, j+2). The sealing layer ECL covers the entire pixel areas defined on the base substrate SUB.

In an alternative exemplary embodiment, the display panel DP may include an opposite substrate (not shown) facing the base substrate SUB. The opposite substrate may be disposed on the sealing layer ECL. The opposite substrate may include color filters. In an exemplary embodiment, the sealing layer may be omitted from the display panel DP. In such an embodiment, where the sealing layer is omitted from the display panel DP, the opposite substrate may function as the sealing layer.

Figure 6:
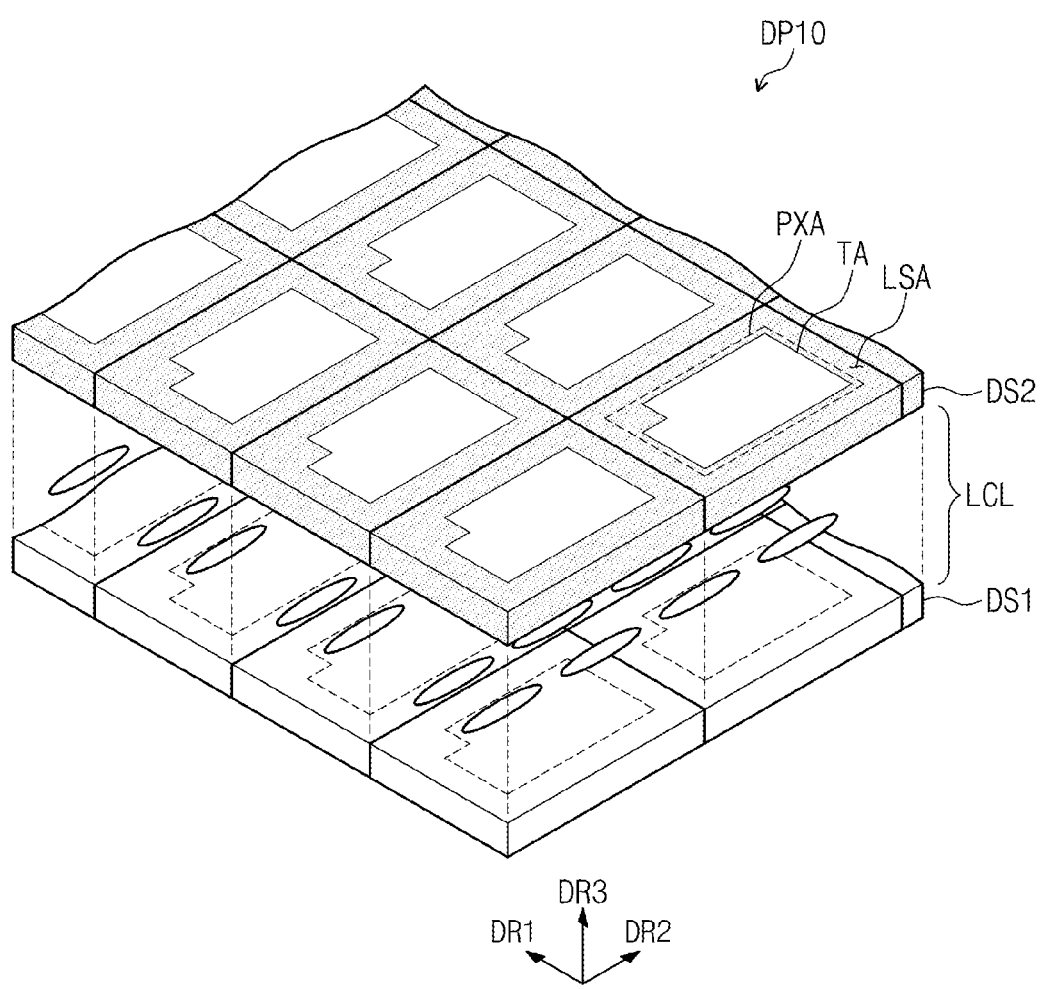
FIG. 6 is a perspective view showing a portion of an exemplary embodiment of a display panel according to the invention.
Figure 7:
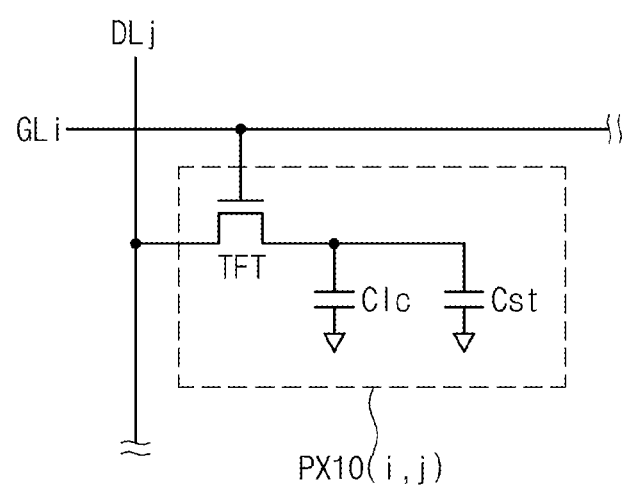
FIG. 7 is an equivalent circuit diagram showing an exemplary embodiment of a pixel according to the invention.

FIG. 6 is a perspective view showing a portion of an exemplary embodiment of a display panel according to the invention. FIG. 7 is an equivalent circuit diagram showing an exemplary embodiment of a pixel according to the invention.

Referring to FIG. 6, an exemplary embodiment of a display panel DP10 includes a first display substrate DS1 and a second display substrate DS2. The first display substrate DS1 and the second display substrate DS2 are spaced apart from each other in a thickness direction (hereinafter, referred to as a third direction DR3). A liquid crystal layer LCL is interposed between the first display substrate DS1 and the second display substrate DS2.

The display panel DP 10 includes display areas TA for displaying images and a non-display area LSA disposed adjacent to the display areas TA. The display areas TA transmit light generated by a backlight unit (not shown) and traveling thereto. The non-display area LSA blocks the light generated by the backlight unit and traveling thereto.

The display panel DP10 includes pixels and signal lines for applying signals to the pixels. The pixels are disposed to correspond to the display areas TA, respectively. Each of the pixels includes a display element and a circuit part to control the display element. The display element overlaps the display area TA. The signal lines overlap the non-display area LSA.

In an exemplary embodiment, as shown in FIG. 6, a pixel area PXA has an area greater than an area of a display area TA corresponding thereto. The pixel area PXA may be wider than the display area TA by an area in which the circuit part is disposed.

Each of the pixels has a same equivalent circuit as a pixel PX10(i, j) shown in FIG. 7. In an exemplary embodiment, as shown in FIG. 7, the pixel PX10(i, j) includes a liquid crystal capacitor Clc as the display element and a thin film transistor TFT as the circuit part. In such an embodiment, the pixel PX10(i, j) includes a storage capacitor Cst connected in parallel to the liquid crystal capacitor Clc. In an alternative exemplary embodiment, the storage capacitor Cst may be omitted.

The thin film transistor TFT is connected to a corresponding gate line GLi and a corresponding data line DLj. The thin film transistor TFT outputs a data signal applied to the corresponding data line DLj in response to a gate signal applied to the corresponding gate line GLi.

The liquid crystal capacitor Clc is charged with a voltage corresponding to the data signal. The liquid crystal capacitor Clc includes two electrodes and a liquid crystal layer. The storage capacitor Cst includes two electrodes, one of which is defined by a portion of a common line, and an insulating layer interposed between the two electrodes.

The corresponding gate line GLi and the corresponding data line DLj may be disposed on a same display substrate, that is, one of the first display substrate DS1 and the second display substrate DS2. The two electrodes of the liquid crystal capacitor Clc may be disposed on one of the first display substrate DS1 and the second display substrate DS2, which may be determined based on the operational mode of the display panel DP10, or disposed on the first and second display substrates DS1 and DS2, respectively. Details on this will be described later.

Figure 8:
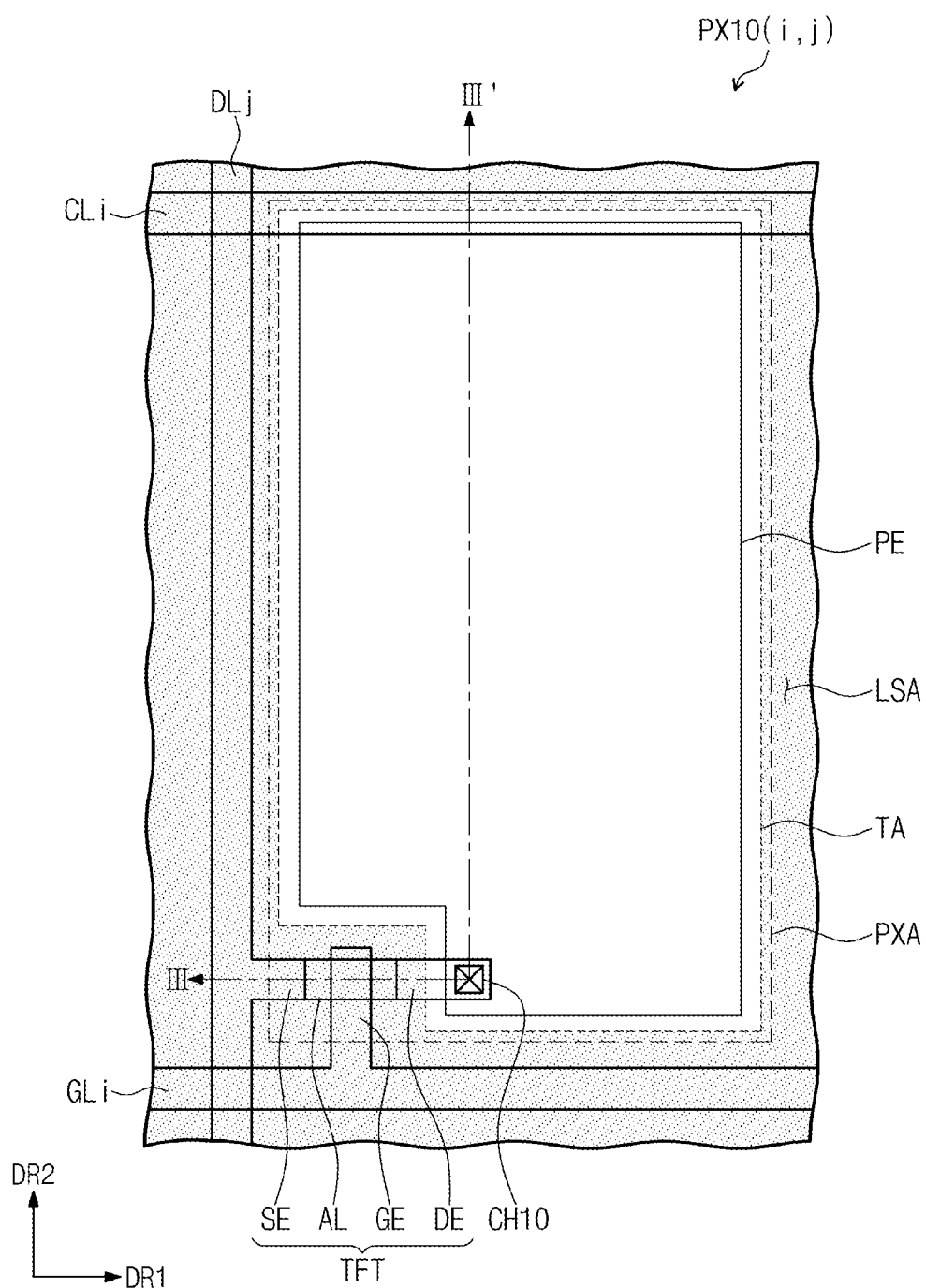
FIG. 8 is a plan view showing an exemplary embodiment of a pixel according to of the invention.
Figure 9:
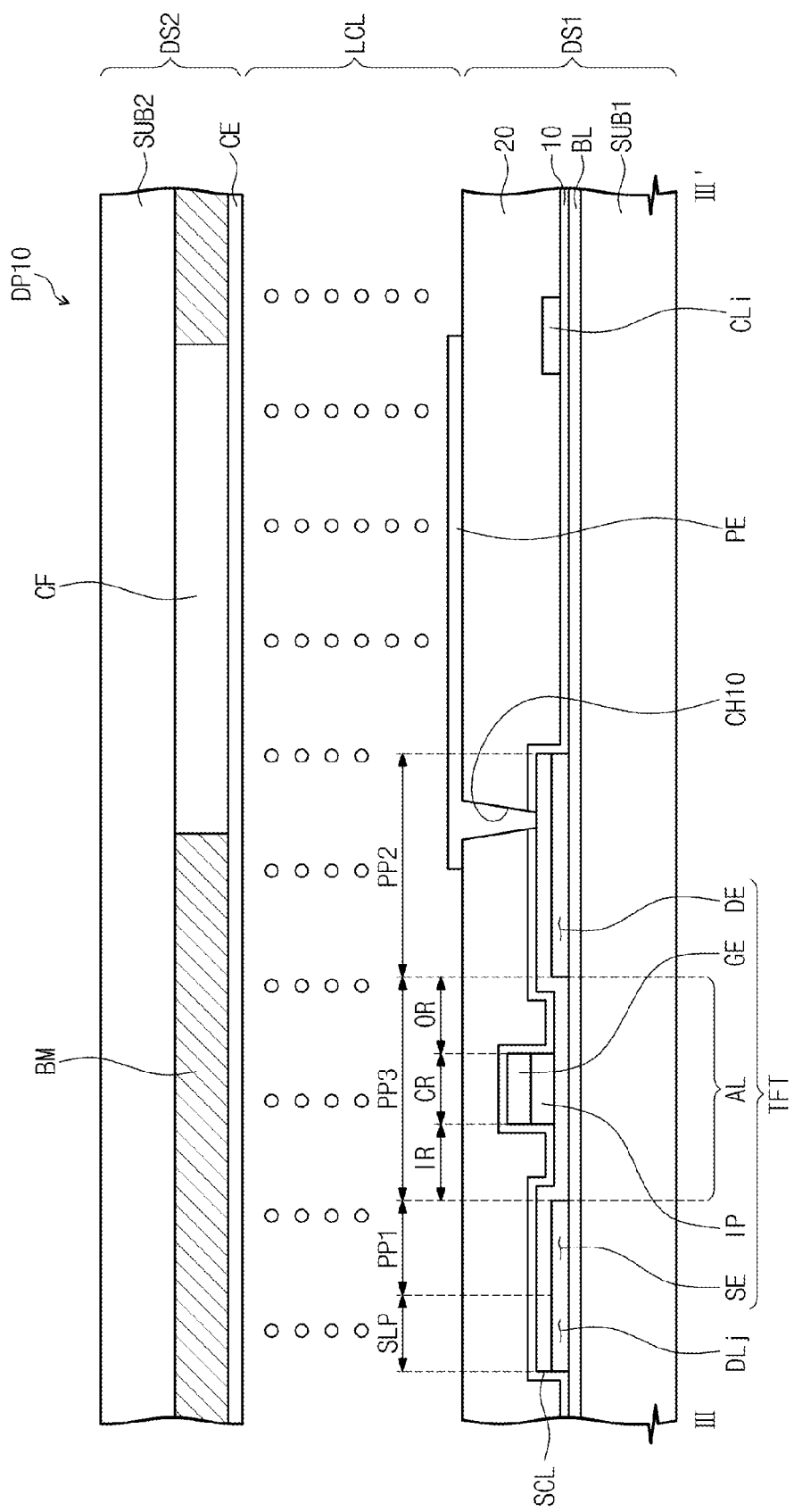
FIG. 9 is a cross-sectional view taken along line III-III' of the display panel shown in FIG. 8.

FIG. 8 is a plan view showing an exemplary embodiment of a pixel according to the invention. FIG. 9 is a cross-sectional view showing an exemplary embodiment of a display panel according to the invention. FIG. 9 shows the cross-section taken along line III-III' of FIG. 8. The same or like elements shown in FIGS. 8 and 9 have been labeled with the same reference characters as used above to describe the exemplary embodiments of the display panel in FIGS. 1 to 5, and any repetitive detailed description thereof will hereinafter be omitted or simplified.

FIGS. 8 and 9 show an exemplary embodiment where the pixel PX10(i, j) has the same equivalent circuit as the pixel PX10(i, j) of FIG. 7. In such an embodiment shown in FIGS. 8 and 9, the display panel may be operated in a vertical alignment ("VA") mode.

The first display substrate DS1 includes a first base substrate SUB1, an i-th gate line GLi, a j-th data line DLj, a common line CLi, a thin film transistor TFT, a plurality of insulating layers 10 and 20, and a pixel electrode PE.

The j-th data line DLj and the thin film transistor TFT are disposed on the buffer layer BL. The thin film transistor TFT includes an input electrode SE, an output electrode DE, an active part AL, and a control electrode GE.

In such an embodiment, the input electrode SE, the output electrode DE, the active part AL, and the control electrode GE of the thin film transistor TFT correspond to the first input electrode SE1, the first output electrode DE1, the first active part ALL and the first control electrode GE1 of the first thin film transistor TFT1 shown in FIG. 4, respectively.

In such an embodiment, as shown in FIG. 9, the output electrode DE of the thin film transistor TFT is electrically connected to the pixel electrode PE through a second portion PP2 of a semiconductor layer SCL disposed on the output electrode DE.

The first insulating layer 10 is disposed on the buffer layer BL to cover the thin film transistor TFT. The common line CLi is disposed on the first insulating layer 10. The common line CLi is applied with a voltage having substantially the same voltage level as that of a voltage applied to a common electrode CE, which will be described later in detail. A second insulating layer 20 is disposed on the first insulating layer 10. The second insulating layer 20 may provide a planarized surface on the first insulating layer 10. The pixel electrode PE is disposed on the planarized surface of the second insulating layer 20. The pixel electrode PE is connected to the second portion PP2 of the semiconductor layer SCL through a contact hole CH10 defined or formed penetrating through the first and second insulating layers 10 and 20.

The second display substrate DS2 includes a second base substrate SUB2, a black matrix BM, a color filter CF, and the common electrode CE. An area where the black matrix BM is disposed corresponds to the non-display area LSA, and an area where the black matrix BM is not disposed corresponds to the display area TA. The color filter CF overlaps the display area TA. The second display substrate DS2 includes color filters having different colors from each other. In one exemplary embodiment, for example, a portion of the color filters has a red color, another portion of the color filters has a green color, and the other portion of the color filters has a blue color.

The common electrode CE is disposed on the black matrix BM and the color filter CF. In an alternative exemplary embodiment, the second display substrate DS2 may further include a planarization layer (not shown) to cover the black matrix BM and the color filter CF. In such an embodiment, the common electrode CE may be disposed on the planarization layer.

The common electrode CE includes a transparent conductive material. In an exemplary embodiment, the common electrode CE may include a transparent conductive inorganic material, e.g., ITO or IZO, for example.

In an alternative exemplary embodiment, the common electrode CE may be disposed on the first base substrate SUB1 according to the operational mode of the display panel DP10, such as an in-plane switching ("IPS") mode, a fringe-field switching ("FFS") mode, a plane to line switching ("PLS") mode, etc.

In such an embodiment, the thin film transistor TFT has substantially the same structure as the first thin film transistor TFT1 described with reference to FIGS. 3 and 4, contact holes for connecting the portions of the semiconductor layer SCL to the input electrode SE and the output electrode DE may be omitted. As described above, in such an embodiment, the structure of the thin film transistor TFT becomes simplified, and thus the aperture ratio of the pixel PX10(i, j) is increased.

In such an embodiment, when the thin film transistor TFT is turned on, a current path of the thin film transistor TFT is formed via the input electrode SE, the second portion PP2 of the semiconductor layer SCL, the output electrode DE, and the pixel electrode PE. Accordingly, in such an embodiment, a contact resistance between the thin film transistor TFT and the pixel electrode PE does not increase, such that the signal delay, e.g., RC delay does not occur in the thin film transistor TFT.

Figure 10:
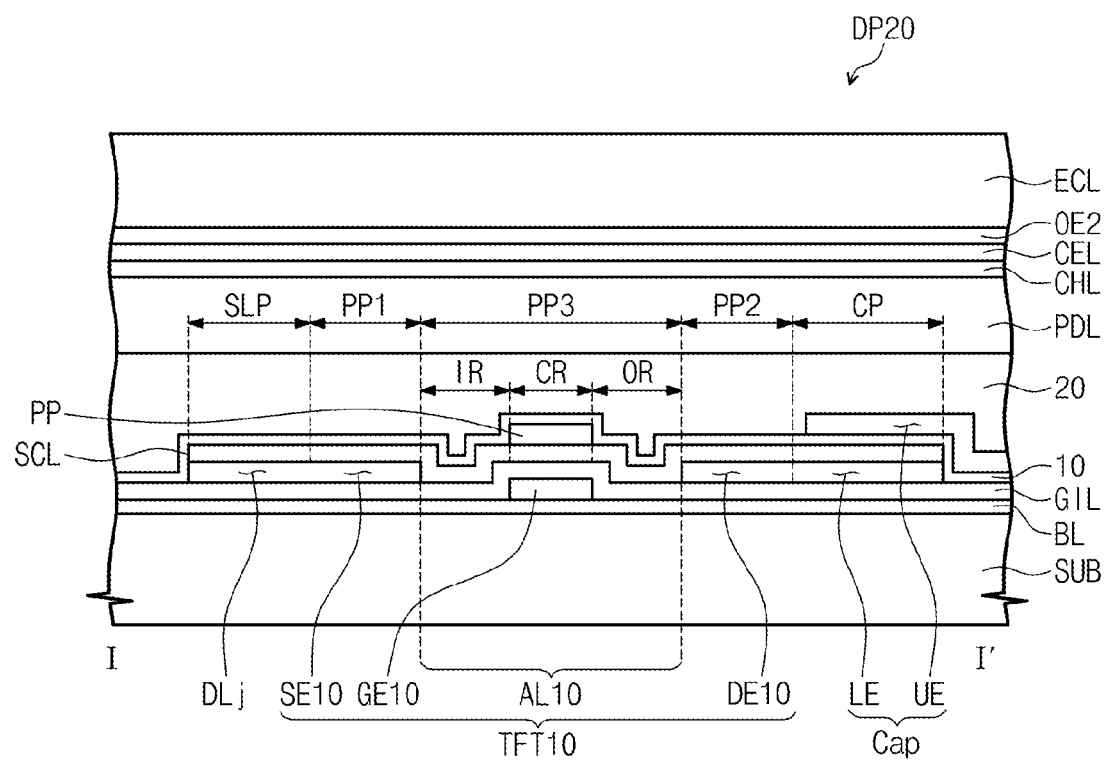
FIG. 10 is a cross-sectional view showing an alternative exemplary embodiment of a display panel according the invention.

FIG. 10 is a cross-sectional view showing an alternative exemplary embodiment of a pixel according to the invention. FIG. 10 shows the cross-section of an alternative exemplary embodiment of the pixel corresponding to FIG. 4. In FIG. 10, the same or like elements have been labeled with the same reference characters as used above to describe the exemplary embodiments of the pixel shown in FIGS. 3 and 4, and any repetitive detailed description thereof will hereinafter be omitted or simplified.

In an exemplary embodiment, as shown in FIG. 4, a transistor of a display panel may have a top-gate structure. In an alternative exemplary embodiment, as shown in FIG. 10, a display panel DP20 may include a thin film transistor having a bottom-gate structure.

In an exemplary embodiment, as shown in FIG. 10, a first control electrode GE10 is disposed on a buffer layer BL. In such an embodiment, an insulating layer GIL (hereinafter, referred to as a gate insulating layer) is disposed on the buffer layer BL to cover the first control electrode GE10. A j-th data line DLj, a first input electrode SE10, a first output electrode DE10 and a lower electrode LE are disposed on the gate insulating layer GIL.

Portions of a semiconductor layer SCL are disposed on the gate insulating layer GIL. A first portion PP1 of the semiconductor layer SCL is disposed on the first input electrode SE1 and a second portion PP2 of the semiconductor layer SCL is disposed on the first output electrode DE1. A third portion PP3 of the semiconductor layer SCL is disposed on the gate insulating layer GIL. The sixth portion PP3 corresponds to an active part AL10 of the first thin film transistor TFT10.

A line portion SLP of the semiconductor layer SCL is disposed on the j-th data line DLj. A capacitance portion CP of the semiconductor layer SCL is disposed on the lower electrode LE. A protection pattern portion PP is disposed on the third portion PP3 of the semiconductor layer SCL. The protection pattern portion PP overlaps a channel region CR of the third portion PP3. In such an embodiment, the channel region CR of the third portion PP3 is protected by the protection pattern portion PP, such that the channel region CR is not reduction-treated during a manufacturing process thereof A first insulating layer 10 is disposed on the gate insulating layer GIL to cover the semiconductor layer SCL and the protection pattern portion PP. An upper electrode UE is disposed on the first insulating layer 10 to overlap the lower electrode LE.

In such an embodiment, the first thin film transistor TFT10 shown in FIG. 10 has the structure substantially the same as the structure of the first thin film transistor TFT10 described with reference to FIGS. 3 and 4, such that contact holes may be omitted. Thus, in such an embodiment, the circuit configuration of the pixel PX10(i, j) becomes simplified, and the aperture ratio of the pixel PX10(i, j) is increased, and the signal delay, e.g., RC delay does not occur in the first thin film transistor TFT10.

In such an embodiment of the display panel, the second thin film transistor TFT2 shown in FIG. 5 may have the bottom-gate structure. In an exemplary embodiment, the thin film transistor TFT of a liquid crystal display panel shown in FIG. 9 may have the bottom-gate structure.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display panel comprising:
   a base substrate comprising a pixel area and a peripheral area;
   a semiconductor layer disposed on a portion of the base substrate;
   a display element disposed in the pixel area; and
   a first thin film transistor which controls the display element and comprises an input electrode, an output electrode and a control electrode,
   wherein the semiconductor layer comprises:
   a first portion disposed on the input electrode of the first thin film transistor, and the first portion covering the input electrode;
   a second portion disposed on the output electrode of the first thin film transistor, and the second portion covering the output electrode; and
   a third portion overlapping the control electrode of the first thin film transistor and defining a channel of the first thin film transistor,
   wherein the third portion is directly connected to the first portion and the second portion so as to form one body with the first portion and the second portion.

2. The display panel of claim 1, wherein the semiconductor layer comprises a metal oxide semiconductor material.

3. The display panel of claim 2, wherein the first thin film transistor further comprises:
   an insulating pattern portion disposed on the semiconductor layer to overlap a portion of the third portion,
   wherein the control electrode of the first thin film transistor is disposed on the insulating pattern portion.

4. The display panel of claim 3, wherein the third portion comprises:
   an input region connected to the first portion and comprising a reduced metal from the metal oxide semiconductor material;
   an output region connected to the second portion and comprising the reduced metal from the metal oxide semiconductor material; and
   a channel region disposed between the input region and the output region to connect the input region and the output region, wherein the channel region overlaps the insulating pattern portion.

5. The display panel of claim 2, further comprising:
   an insulating layer disposed between the control electrode of the first thin film transistor and the semiconductor layer,
   wherein the control electrode is disposed to face the semiconductor layer and is disposed under the third portion.

6. The display panel of claim 5, wherein the third portion comprises:
   an input region connected to the first portion and comprising a reduced metal from the metal oxide semiconductor material;
   an output region connected to the second portion and comprising the reduced metal from the metal oxide semiconductor material; and
   a channel region disposed between the input region and the output region to connect the input region and the output region, wherein the channel region overlaps the control electrode.

7. The display panel of claim 6, wherein the first thin film transistor further comprises:
   a protection pattern portion disposed on the channel region of the third portion.

8. The display panel of claim 2, further comprising:
   a data line disposed in the peripheral area, connected to the input electrode of the first thin film transistor, and extending substantially in a first direction,
   wherein the semiconductor layer further comprises a line portion connected to the first portion and which overlaps the data line.

9. The display panel of claim 8, wherein the line portion has a width in a second direction, which is substantially perpendicular to the first direction, substantially the same as a width of the data line in the second direction.

10. The display panel of claim 9, further comprising:
    a gate line disposed in the peripheral area, connected to the control electrode, and extending substantially in the second direction.

11. The display panel of claim 9, wherein the line portion comprises a reduced metal from the metal oxide semiconductor material.

12. The display panel of claim 1, further comprising:
    a second thin film transistor which controls a driving current flowing through the display element; and
    a capacitor comprising:
    a lower electrode connected to the output electrode; and
    an upper electrode connected to the control electrode,
    wherein the display element comprises an organic light emitting diode.

13. The display panel of claim 12, wherein the organic light emitting diode comprises:
    a first electrode connected to an output electrode of the second thin film transistor;
    an organic light emitting layer disposed on the first electrode; and
    a second electrode disposed on the organic light emitting layer.

14. The display panel of claim 12, wherein the semiconductor layer further comprises:
    a capacitance portion connected to the second portion and disposed on the lower electrode of the capacitor.

15. The display panel of claim 1, further comprising:
    an opposite substrate disposed opposite to the base substrate; and
    a liquid crystal layer interposed between the base substrate and the opposite substrate,
    wherein the display element comprises a liquid crystal capacitor.

16. A display panel comprising:
    a base substrate comprising a pixel area and a peripheral area;
    a conductive layer disposed on the base substrate;
    a metal oxide semiconductor layer disposed on portions of the conductive layer;
    a display element disposed in the pixel area; and
    a thin film transistor which controls the display element,
    wherein the thin film transistor comprises:
    an input electrode comprising a first portion of the conductive layer, and a first portion of the metal oxide semiconductor layer disposed on the first portion of the conductive layer;
    an output electrode comprising a second portion of the conductive layer, and a second portion of the metal oxide semiconductor layer disposed on the second portion of the conductive layer;
    a channel defined by a third portion of the metal oxide semiconductor layer directly connected to the first portion of the metal oxide semiconductor layer and the second portion of the metal oxide semiconductor layer; and a control electrode which is disposed on the third portion of the metal oxide semiconductor layer and insulated from the third portion of the metal oxide semiconductor layer, and wherein the first portion of the metal oxide layer covers the first portion of the conductive layer and the second portion of the metal oxide layer covers the second portion of the conductive layer, and wherein the first portion, the second portion, and the third portion of metal oxide semiconductor form one body.

17. The display panel of claim 16, wherein the thin film transistor further comprises:

an insulating pattern portion disposed on the metal oxide semiconductor layer to overlap a portion of the third portion of the metal oxide semiconductor layer, wherein the control electrode is disposed on the insulating pattern portion.

18. The display panel of claim 16, wherein the third portion of the metal oxide semiconductor layer comprises:

an input region connected to the first portion of the metal oxide semiconductor layer and comprising a reduced metal from the metal oxide semiconductor layer;

an output region connected to the second portion of the metal oxide semiconductor layer and comprising the reduced metal from the metal oxide semiconductor layer; and a channel region disposed between the input region and the output region to connect the input region and the output region.

19. The display panel of claim 16, further comprising:

an insulating layer disposed between the control electrode and the semiconductor layer, wherein the control electrode is disposed to face the metal oxide semiconductor layer and is disposed under the third portion.

20. The display panel of claim 16, further comprising:

a data line disposed in the peripheral area, connected to the input electrode of the thin film transistor, and extending substantially in a first direction; and a gate line disposed in the peripheral area, connected to the control electrode of the thin film transistor, and extending substantially in a second direction, which is perpendicular to the first direction, wherein the metal oxide semiconductor layer further comprises a line portion which overlaps the data line.

* * * * *